US012593692B2

(12) United States Patent
Qu et al.

(10) Patent No.: US 12,593,692 B2
(45) Date of Patent: Mar. 31, 2026

(54) THERMAL MANAGEMENT OF GPU-HBM PACKAGE BY MICROCHANNEL INTEGRATED SUBSTRATE

(71) Applicant: Micron Technology, Inc., Boise, ID (US)

(72) Inventors: Xiaopeng Qu, Boise, ID (US); Hyunsuk Chun, Boise, ID (US); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 18/416,579

(22) Filed: Jan. 18, 2024

(65) Prior Publication Data

US 2024/0203827 A1 Jun. 20, 2024

Related U.S. Application Data

(63) Continuation of application No. 16/990,943, filed on Aug. 11, 2020, now Pat. No. 11,915,997.

(60) Provisional application No. 63/043,718, filed on Jun. 24, 2020.

(51) Int. Cl.
| | |
|---|---|
| *H01L 23/473* | (2006.01) |
| *H01L 21/48* | (2006.01) |
| *H01L 23/367* | (2006.01) |
| *H01L 25/00* | (2006.01) |
| *H01L 25/065* | (2023.01) |
| *H01L 25/18* | (2023.01) |

(52) U.S. Cl.
CPC ...... *H01L 23/4735* (2013.01); *H01L 21/4871* (2013.01); *H01L 23/3672* (2013.01); *H01L 25/0655* (2013.01); *H01L 25/18* (2013.01); *H01L 25/50* (2013.01)

(58) Field of Classification Search
CPC .................................................... H01L 23/4735
USPC ........................................................ 257/713
See application file for complete search history.

(56) References Cited

U.S. PATENT DOCUMENTS

| | | | | | |
|---|---|---|---|---|---|
| 4,747,450 | A | * | 5/1988 | Ikegame | H01L 23/473 |
| | | | | | 257/E23.098 |
| 5,819,858 | A | * | 10/1998 | Nechansky | H01L 21/4857 |
| | | | | | 174/250 |
| 2002/0185718 | A1 | * | 12/2002 | Mikubo | H05K 1/0207 |
| | | | | | 257/E23.09 |

(Continued)

FOREIGN PATENT DOCUMENTS

| CN | 104576567 A | 4/2015 |
|---|---|---|

OTHER PUBLICATIONS

3M Company, Product Information Sheet: "3M Novec 7500 Engineered Fluid", Issued 09/09, (c) 2008 3M, 8 pages.

(Continued)

*Primary Examiner* — Ajay Arora
(74) *Attorney, Agent, or Firm* — Dorsey & Whitney LLP

(57) ABSTRACT

Semiconductor packages and/or assemblies having microchannels, a microchannel module, and/or a microfluidic network for thermal management, and associated systems and methods, are disclosed herein. The semiconductor package and/or assembly can include a substrate integrated with a microchannel and a coolant disposed within the microchannel to dissipate heat from a memory device and/or a logic device of the semiconductor package and/or assembly. The microchannel can be configured beneath the memory device and/or the logic device.

13 Claims, 13 Drawing Sheets

(56)  References Cited

U.S. PATENT DOCUMENTS

| | | |
|---|---|---|
| 2008/0150162 A1 | 6/2008 | Koizumi |
| 2012/0120605 A1* | 5/2012 | Arvelo ............... H05K 7/20772 |
| | | 361/702 |
| 2019/0237389 A1* | 8/2019 | Joshi .................... H01L 23/467 |
| 2021/0407889 A1 | 12/2021 | Qu et al. |

OTHER PUBLICATIONS

Brunschwiler, T. et al., "Experimental Investigation of an Ultrathin Manifold Microchannel Heat Sink for Liquid-Cooled Chips", Journal of Heat Transfer, Aug. 2010, vol. 132, (c) 2010 by ASME, 11 pages.
First Office Action mailed Jul. 28, 2023 for Chinese Patent Application No. 202110612731.1, 12 pages (with translation.).
Kandlikar, S. G., "Review and Projections of Integrated Cooling Systems for Three-Dimensional Integrated Circuits", Journal of Electronic Packaging, Jun. 2014, vol. 136, Transactions of the ASME, (c) 2014 by ASME, 11 pages.
Li, W. et al., "Flow boiling of HFE-7100 in silicon microchannels integrated with multiple micro-nozzles and reentry micro-cavities", International Journal of Heat and Mass Transfer, vol. 123, (c) 2018 Elsevier Ltd., p. 354-366.

* cited by examiner

600

THERMAL MANAGEMENT OF GPU-HBM PACKAGE BY MICROCHANNEL INTEGRATED SUBSTRATE

CROSS-REFERENCE TO RELATED APPLICATION(S)

This application is a continuation of U.S. patent application Ser. No. 16/990,943, filed on Aug. 11, 2020, and issued as U.S. Pat. No. 11,915,997 on Feb. 27, 2024, which claims the benefit of U.S. Provisional Patent Application No. 63/043,718, filed on Jun. 24, 2020, which are each incorporated by reference herein in their entirety.

TECHNICAL FIELD

The present technology generally relates to thermal management of semiconductor assemblies, such as memory and processors, and several embodiments are directed to semiconductor assemblies that include microchannels for thermal management.

BACKGROUND

Semiconductor device manufacturers often seek to make smaller, faster, and/or more powerful devices with a higher density of components for computers, cells phones, pagers, personal digital assistants, and many other products. Semiconductor devices generate heat, and dissipating such heat is necessary for meeting performance specifications of high-performance devices. As semiconductor devices, including, but not limited to, memory devices and microprocessors, have greater capacities and faster performance, the amount of heat generated becomes a limiting factor in many products and poses a challenge to memory module design.

Current designs for thermal management focus on reducing thermal resistance in memory devices and dissipating heat from the top of semiconductor devices. For example, many existing systems have heat spreaders (e.g., heat pipes, vapor chambers) and heatsinks mounted above the semiconductor dies. However, even when top-mounted heat spreaders or heat sinks are used, insufficient heat is dissipated to meet performance specifications in some high-performance devices.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
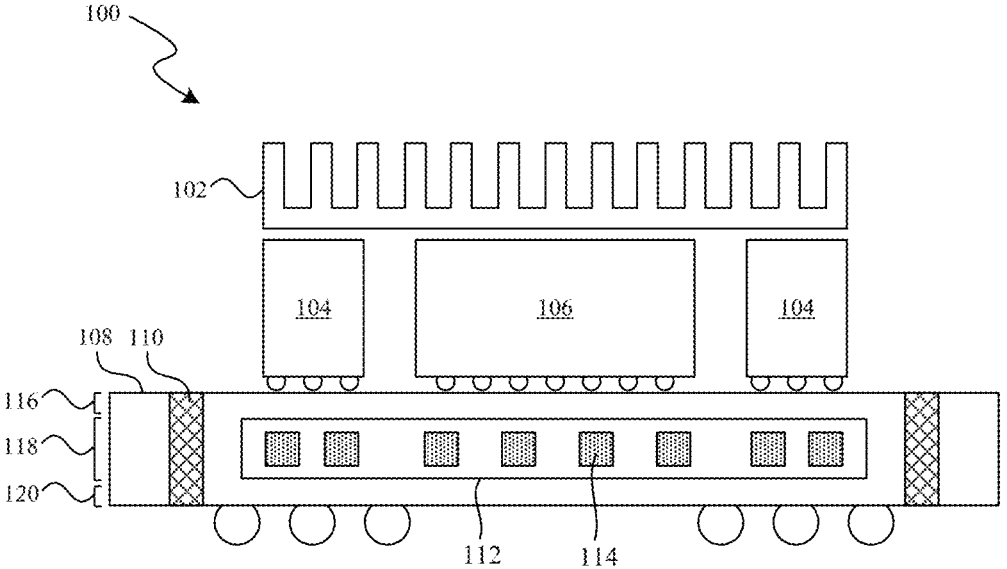
FIG. 1 is a cross-sectional view of a semiconductor package having microchannels configured in accordance with the present technology.

Thermal management of memory modules poses challenges, particularly given the space constraints of industry standard module dimensions and the high heat generated by higher-capacity and higher-bandwidth memory devices (e.g., high-bandwidth memory (HBM) devices). For example, a semiconductor package may include a printed circuit board (PCB) substrate, a memory module including a plurality of memory devices (e.g., HBM devices), and a logic device (e.g., graphics processing unit (GPU)). In many systems where space is a premium (e.g., server racks), there may be very little clearance above the top of the memory module for heat exchanging structures and cooling gases. Accordingly, the performance of conventional heat spreaders may be limited.

Specific details of several embodiments of semiconductor devices, packages, and/or assemblies having microchannels for thermal management are discussed. To convey thermal energy away from the memory devices and the logic device during operation, various thermally conductive structures, such as microchannels under the semiconductor devices, may be provided. The semiconductor devices, packages, and/or assemblies can be integrated with microchannels, and a coolant can be disposed and flowed through the microchannels to dissipate heat from the semiconductor device, packages, and/or assemblies.

Several embodiments of semiconductor devices, packages, and/or assemblies in accordance with the present technology can include one or more memory devices (e.g., HBM devices) mounted over a logic device (e.g., GPU). Several embodiments of the present technology can provide improved thermal management of memory modules by providing a package substrate with integrated microchannels containing a cooling medium. For example, microchannels can be integrated into the interposer or other package substrate beneath a GPU-HBM chipset. During operation, a coolant can be disposed through the microchannels to convey heat away from the GPU and HBM devices and improve heat dissipation of the GPU-HBM chipset.

The term "semiconductor device" generally refers to a solid-state device that includes one or more semiconductor materials. Examples of semiconductor devices include logic devices, memory devices, microprocessors, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-6.

Many embodiments of the present technology are described below in the context of microchannels integrated into the substrate of a semiconductor package to remove heat generated by the semiconductor package from beneath the memory modules and logic devices. A person having ordinary skill in the relevant art will also understand that the present technology may have embodiments for forming microchannels as a unit separate from the substrate within a semiconductor assembly. The present technology may accordingly be practiced without several of the details of the embodiments described herein with reference to FIGS. 1-6. For example, some details of semiconductor devices and/or packages well known in the art have been omitted so as not to obscure the present technology. In general, it should be understood that various other devices and systems in addition to those specific embodiments disclosed herein may be within the scope of the present technology.

For case of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a cross-sectional view of a semiconductor package 100 ("package 100") having microchannels 114 configured in accordance with embodiments of the present technology. The package 100 can include one or more memory devices 104, a logic device 106, a heatsink 102, and a package substrate 108 ("substrate 108"). The heatsink 102 can be mounted on top of the memory devices 104 and logic device 106 to remove heat via the top of the devices. The substrate 108 can include a microchannel module 112 ("module 112") and vias 110. The substrate 108 can be divided into three regions and/or portions: a mounting portion 116, a core region 118, and a base portion 120. The mounting portion 116 can include mounting sites, wherein each mounting site includes electrical contacts (not shown). The base portion 120 can include terminals that are electrically coupled to the contacts on the mounting sites by circuitry in the substrate 108. The core region 118 is between the mounting portion 116 and the base portion 120. The module 112 can be integrated into the core region 118 such that the module 112 is opposite the heatsink 102 with the devices 104 and 106 therebetween. For example, the substrate 108 can be configured such that the module 112 is beneath the memory devices 104 and logic device 106 to remove heat via the bottom of the devices while the heatsink 102 removes heat via the top. In some embodiments, the memory device 104 can be an HBM device, the logic device 106 can be a GPU, and the substrate 108 can be a PCB. While one module 112 is illustrated in FIG. 1, the substrate 108 can include one or more modules 112, and the module 112 can include one or more microchannels 114. For example, the substrate 108 can include one, two, tens, hundreds, or more modules 112, and each module 112 can include with one, two, tens, hundreds, or more microchannels 114.

Figure 2A:
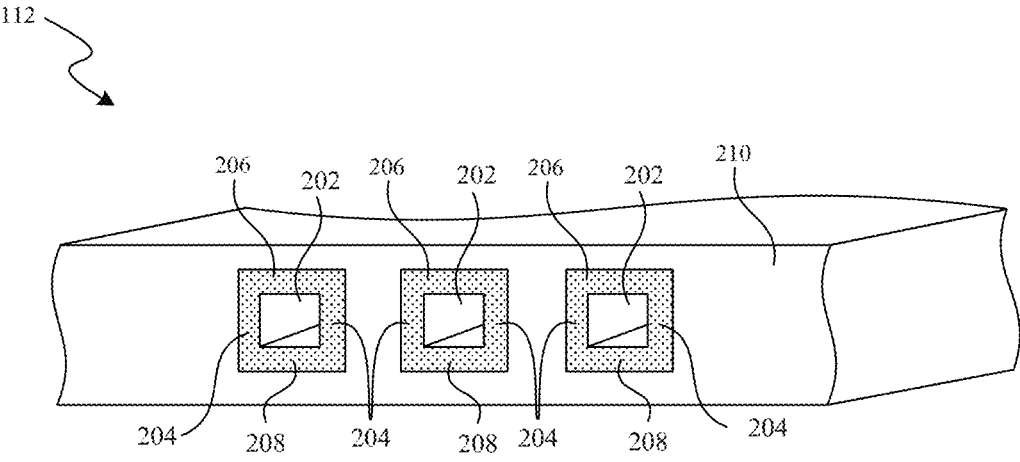
FIGS. 2A-B are enlarged cross-sectional views of microchannel modules having microchannels in accordance with the present technology.
Figure 2B:
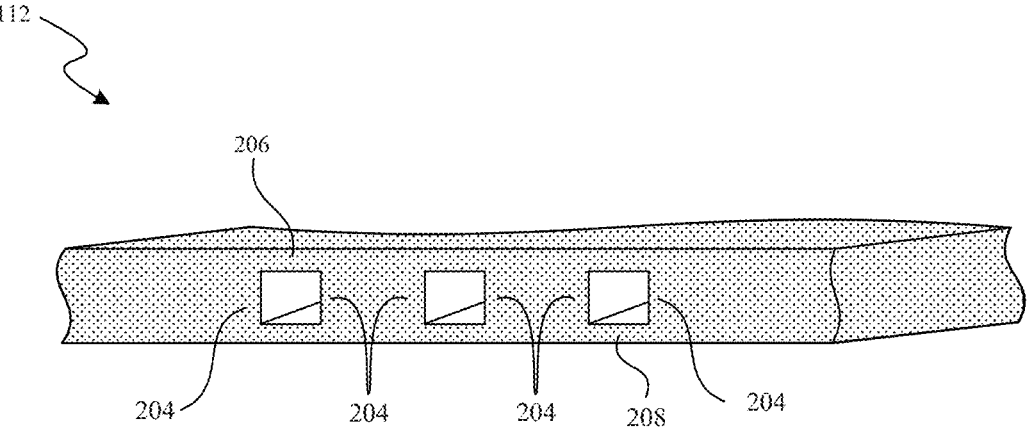

FIGS. 2A and 2B are enlarged cross-sectional views of modules 112 with an aspect of having microchannels 114 in accordance with the present technology. The microchannels 114 can be ducts 202 defined by walls 204, a top portion 206, and a bottom portion 208. The walls 204, top portion 206, and bottom portion 208 can be made of a thermally conductive material. A coolant can be disposed within the ducts 202. The module 112 can have a height of less than 2 mm. In some embodiments, the module 112 can have a height of approximately 0.8 mm. The wall 204 can have a width of less than 0.25 mm. In some embodiments, the wall 204 can have a height of approximately 0.15 mm. While the cross section of the ducts 202 is shown to be approximately square in FIGS. 2A and 2B, the ducts 202 can have other cross-sectional shapes (e.g., rectangular, rectilinear, circular, oval, elliptical, oblong, irregular, or any combination thereof).

Referring to FIG. 2A, the module 112 can have individual ducts 202 and a module substrate 210 encasing the ducts 202. The individual ducts 202 are defined by thermally conductive walls 204, a top portion 206, and a bottom portion 208. For example, a duct 202 is separated from another duct 202 by the thermally conductive wall 204 and the module substrate 210. Suitable materials for the thermally conductive walls 204, top portions 206, and bottom portions 208 include silicon, copper, aluminum, silver, gold, alloys thereof, an organic material, and the like. Suitable materials for the module substrate 210 include silicon, copper, aluminum, silver, gold, alloys thereof, an organic material, and the like. The materials for the ducts 202 can be selected based on the coolant used in the system, while the materials for the module substrate can be selected based on machinability, cost, and the like. The materials for the ducts 202 and the module substrate 201 can be different.

In an alternative configuration of the module 112 as shown in FIG. 2B, the module 112 is made of a contiguous mass of thermally conductive material, and the ducts 202 are formed directly in the mass of thermally conductive material. The walls 204, top portions 206, and bottom portions 208 of the ducts 202 are accordingly the regions of the contiguous mass of thermally conductive material. The module 112 shown in FIG. 2B does not include a module substrate, such as the module substrate 210 shown in FIG. 2A. Suitable materials for the thermally conductive module 112 include silicon, copper, aluminum, silver, gold, alloys thereof, an organic material, and the like.

Figure 2C:
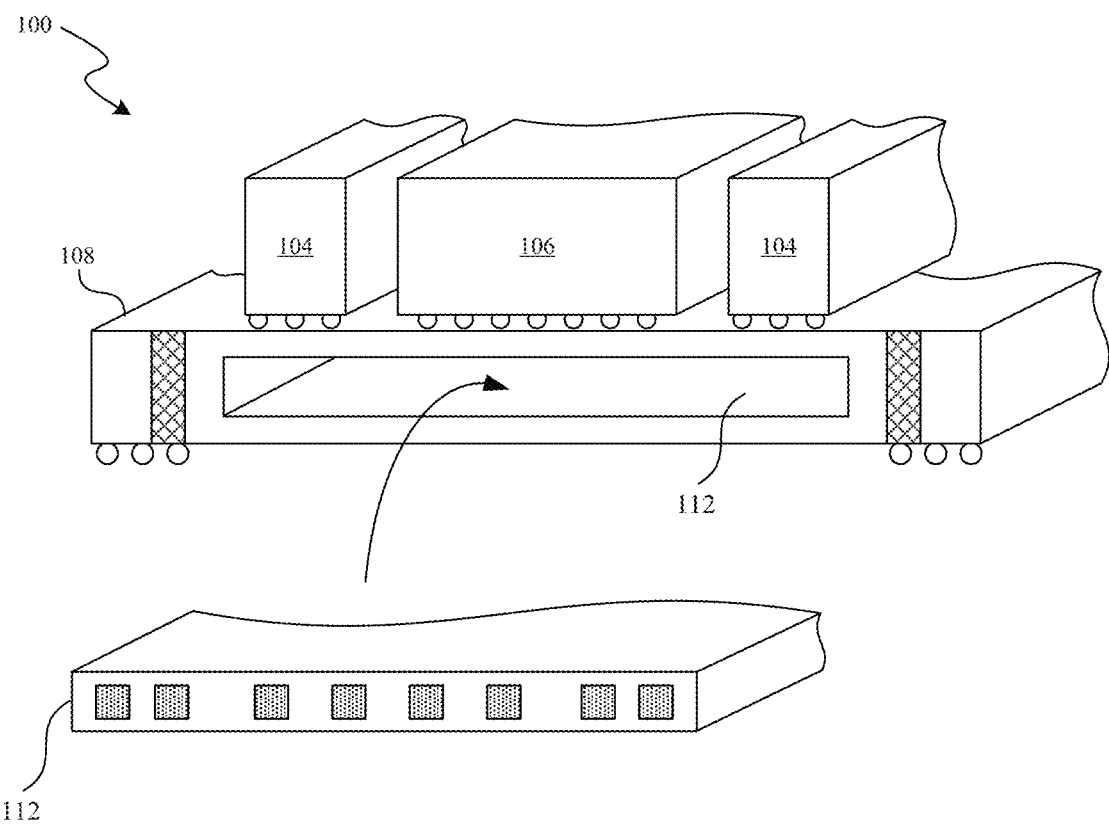
FIGS. 2C and 2E are cross-sectional views of semiconductor packages showing the module separated from the substrate.
Figure 2D:
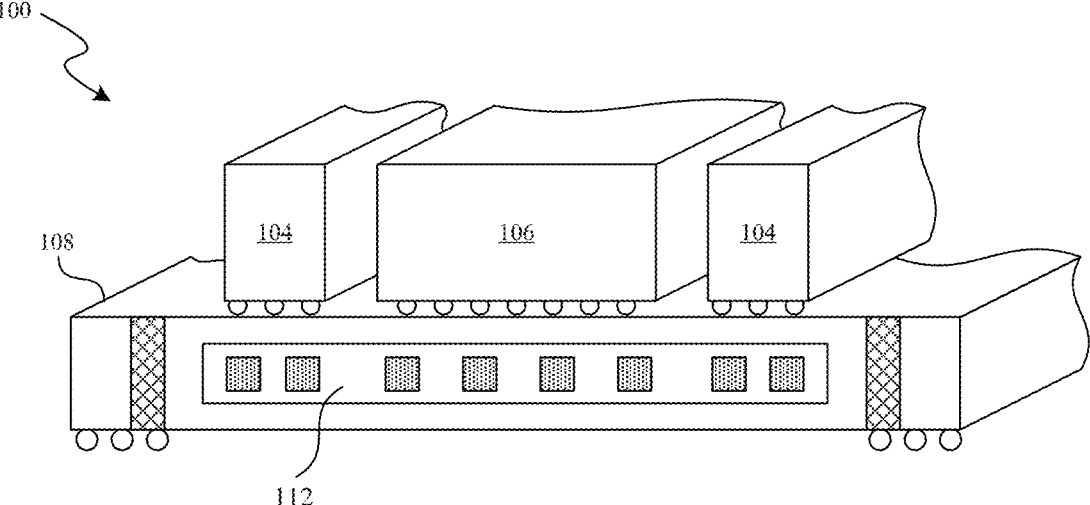
FIGS. 2D and 2F are cross-sectional views of the semiconductor packages showing the module assembled to the substrate.
Figure 2E:
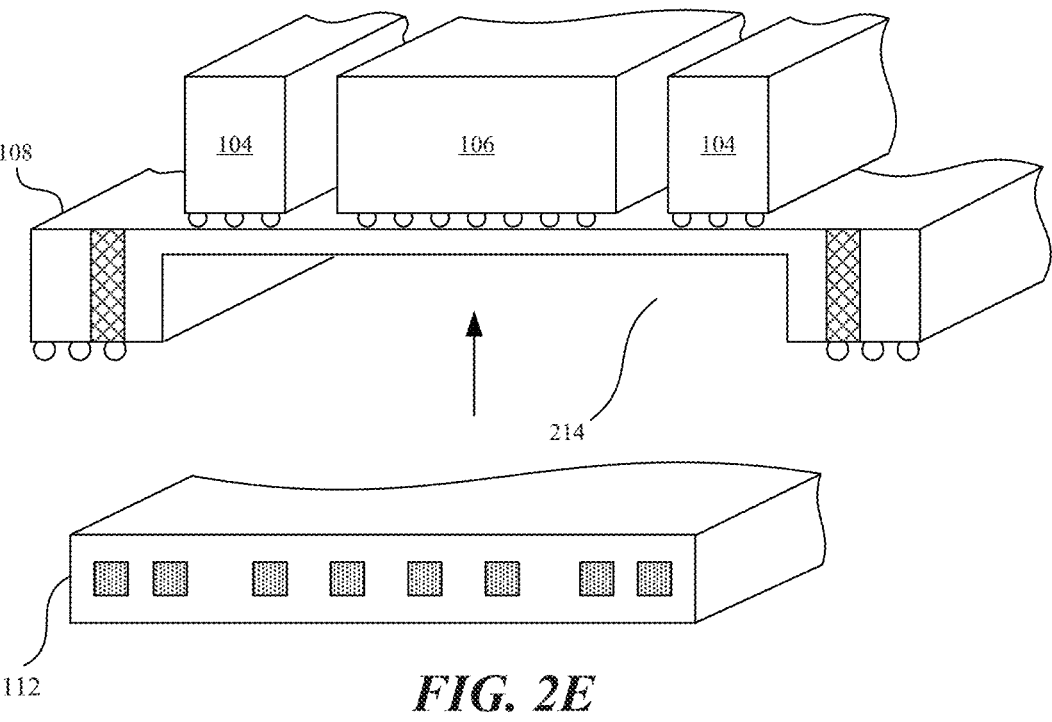
Figure 2F:
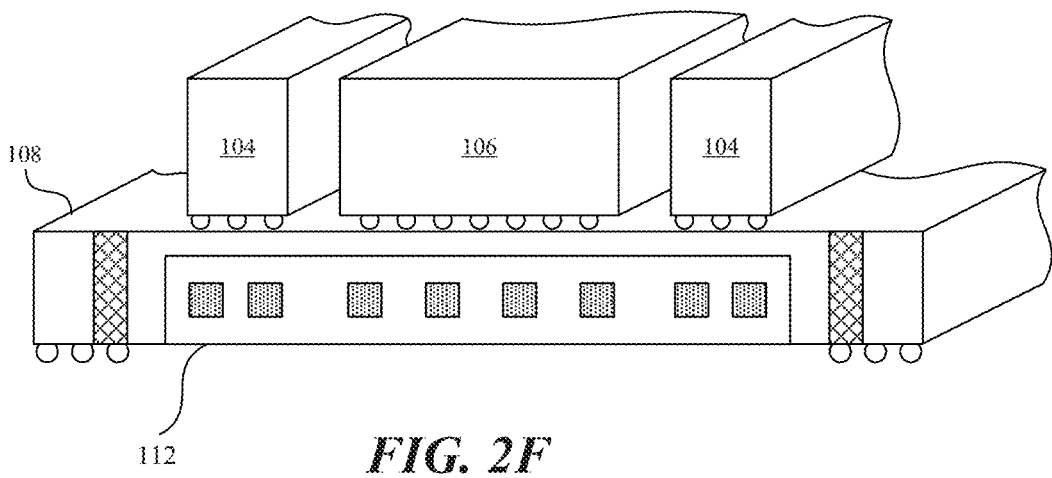

FIG. 2C is a cross-sectional view of a semiconductor package 100 showing the module 112 separated from the substrate 108, and FIG. 2D shows the package 100 of FIG. 2C after the module 112 has been assembled with the substrate 108. In this embodiment, the substrate 108 has a slot 212 for receiving the module 112. FIG. 2E is a cross-sectional view of another semiconductor package 100 showing the module 112 separated from the substrate 108, and FIG. 2F shows the package 100 of FIG. 2E after the module has been assembled with the substrate. In this embodiment, the substrate 108 has a groove 214 for receiving the module 112. Referring to FIGS. 2C-F together, the slot 212 (FIG. 2C) or groove 214 (FIG. 2E) can be formed during various stages of assembly of the package 100. The module 112 can be inserted into the slot 212 or groove 214 of the substrate 108 at various stages of assembly of the package 100. Although FIGS. 2C-F show the module 112 being inserted into the slot 212 or groove 214 of the substrate 108, the assembly of the module 112 in package 100 can include other processes. For example, the module 112 and substrate 108 can be formed simultaneously as an individual unit in contrast to being formed as separate units and assembled together.

FIGS. 3A-D are schematic views of a layout of a microfluidic network 300 ("network 300") in accordance with the present technology. The network 300 can include one or more modules 112. Each module 112 can include one or more microchannels 114. The microchannel 114 can have a serpentine path within the module 112. The microchannel 114 can include one or more central inlets, one or more peripheral outlets, and one or more continuous flow paths between the one or more inlets and the one or more outlets.

Figure 3A:
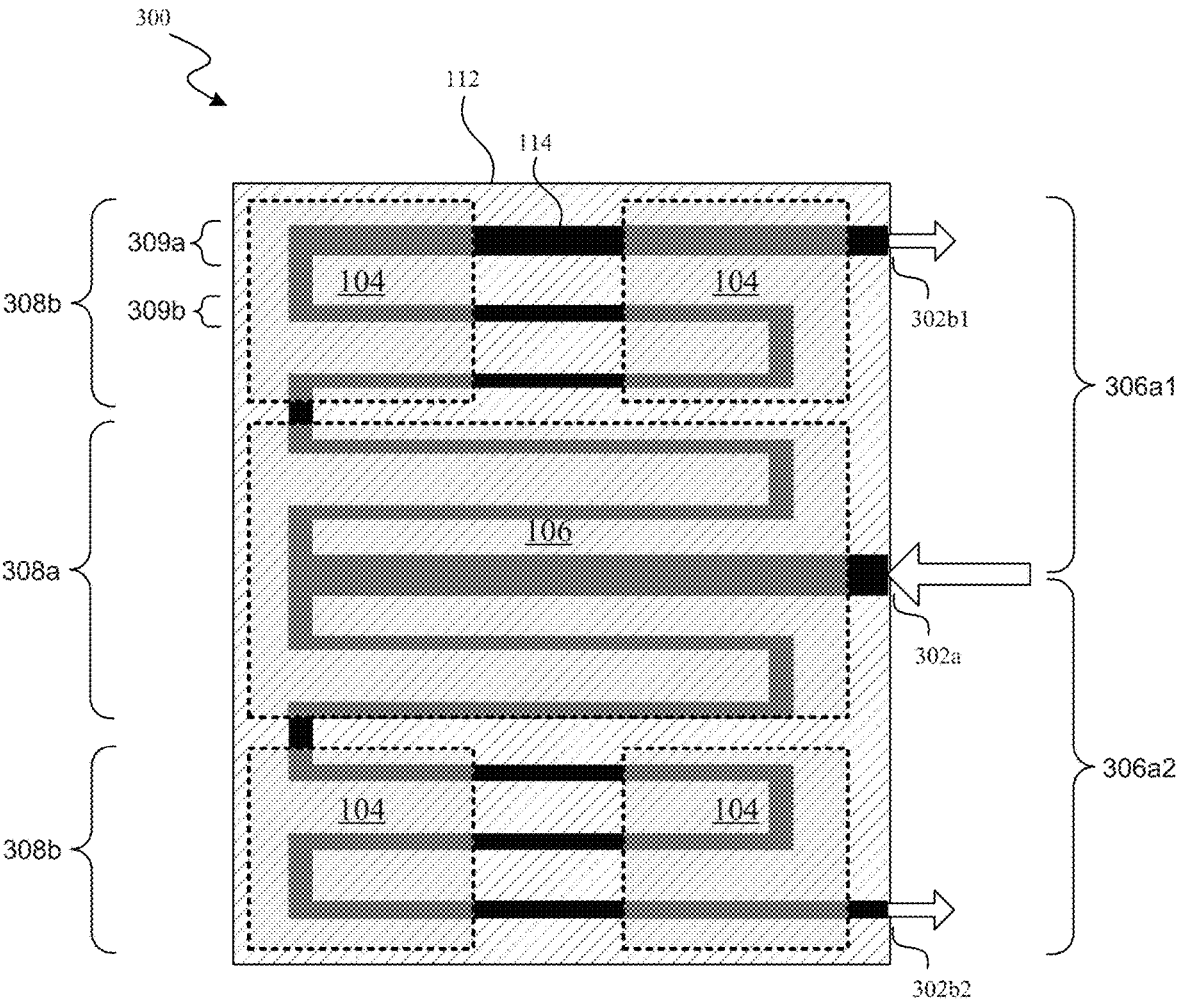
FIGS. 3A-D are schematic views of layouts of microfluidic networks in accordance with the present technology.

In the configuration illustrated in FIG. 3A, the network 300 has a module 112 having a microchannel 114 with a central inlet 302a and peripheral outlets 302b₁ and 302b₂ which are connected via continuous flow paths 306a₁ and 306a₂, respectively. The inlet 302a can be at a first region 308a of the microchannel 114 corresponding to the location of the logic device 106. The outlets 302b₁ and 302b₂ can be at second regions 308b corresponding to locations of the memory devices 104. A coolant flows into the microchannel 114 via the inlet 302a and exits via the outlets 302b₁ and 302b₂. The flow paths 306a₁ and 306a₂ of the coolant remove heat from the logic device 106 first and then the memory devices 104 second. A first portion 309a of the microchannel 114 can extend in at least approximately the same direction as a second portion 309b of the microchannel 114. The first portion 309a can be spaced apart from the second portion 309b by a common thermally conductive wall (e.g., wall 204), such as in the configuration shown in FIG. 2B.

Figure 3B:
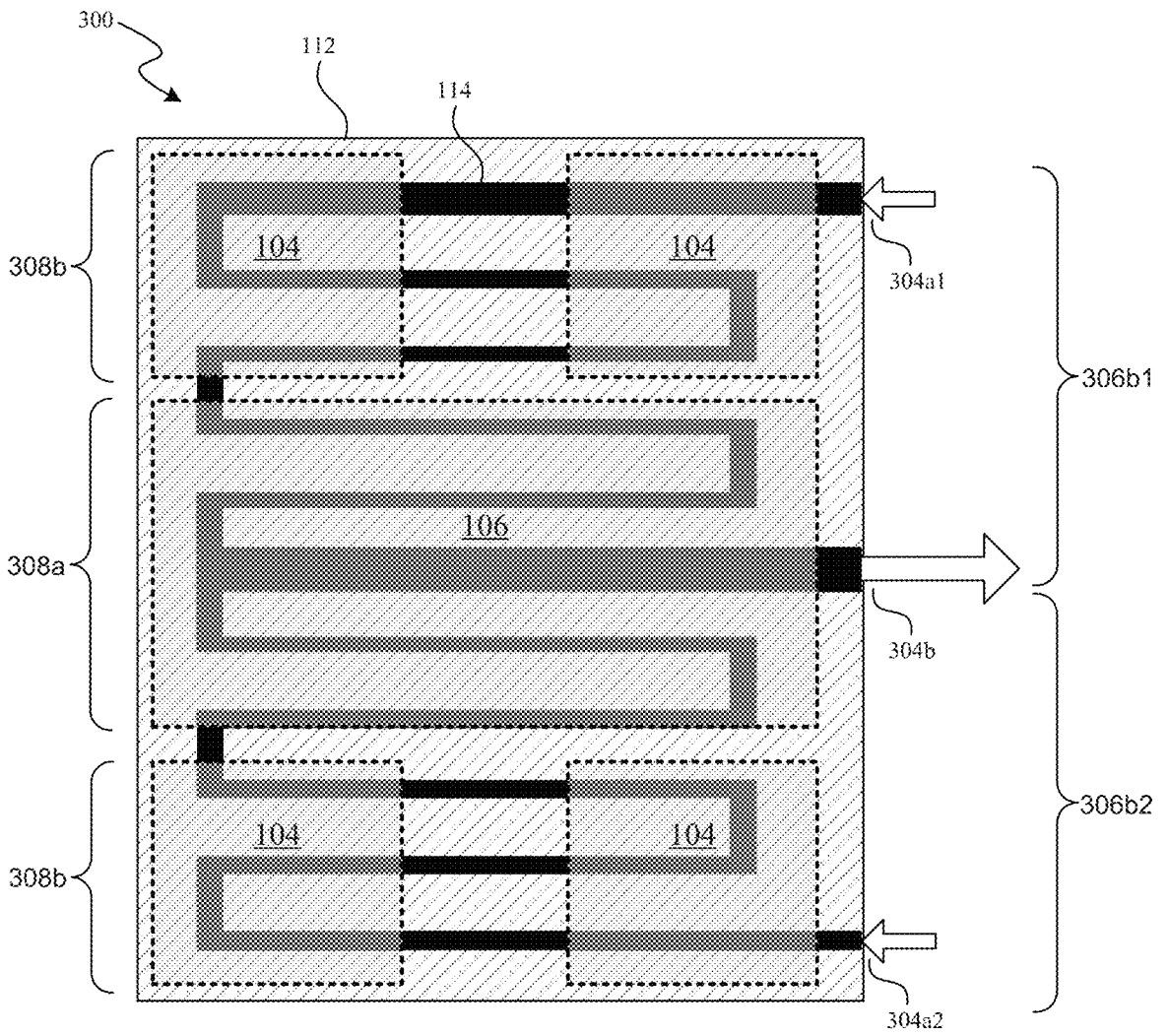

FIG. 3B shows an alternative configuration in which the network 300 has a module 112 having a microchannel 114 with peripheral inlets 304a₁ and 304a₂ and a central outlet 304b connected via continuous flow paths 306a₁ and 306a₂, respectively. The inlets 304a₁ and 304a₂ can be at the first regions 308a of the microchannel 114 corresponding to locations of the memory devices 104. The outlet 304b can be at the second region 308b corresponding to the location of the logic device 106. A coolant flows into the microchannel 114 via the inlets 304a₁ and 304a₂ and exits via the outlet 304b. The flow paths 306b₁ and 306b₂ of the coolant remove heat from the memory devices 104 first and then the logic device 106 second.

Figure 3C:
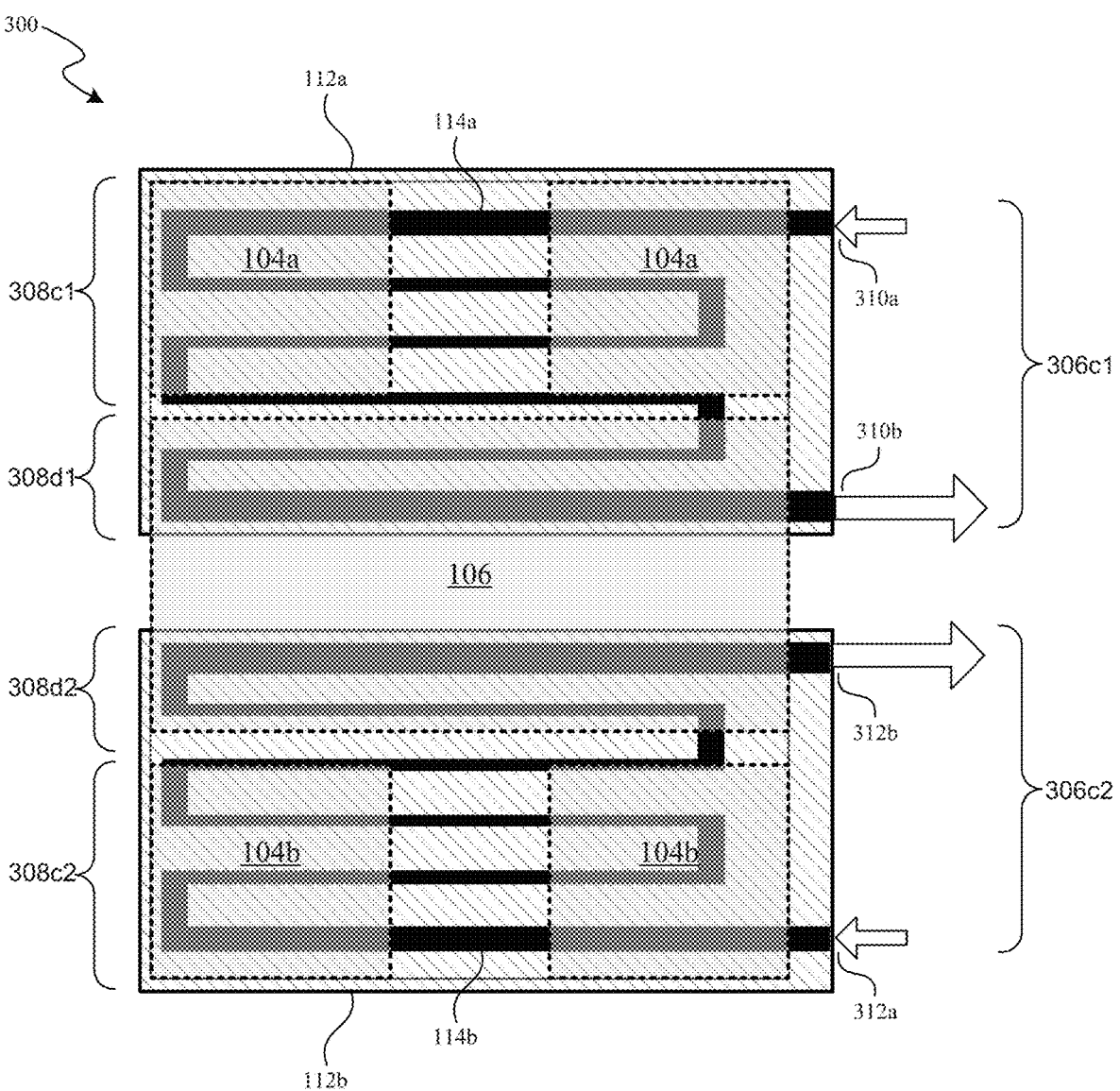

FIG. 3C shows an alternative configuration in which the network 300 has modules 112a and 112b having microchannels 114a and 114b, respectively. An inlet 310a can be at a first region 308c₁ of the microchannel 114a corresponding to locations of memory devices 104a. An outlet 310b can be at a second region 308d₁ corresponding to a portion of the logic device 106. An inlet 312a can be at a first region 308c₂ of the microchannel 114a corresponding to locations of memory devices 104b. An outlet 312b can be at a second region 308d₂ corresponding to a portion of the logic device 106. A coolant flows into the microchannels 114a and 114b via the inlets 310a and 312a and exits via the outlets 310b and 312b, respectively. The flow paths 306c₁ and 306c₂ of the coolant remove heat from the memory devices 104a and 104b, respectively, first and then the logic device 106 second. The flow paths can be reversed with the coolant flowing in the opposite directions in other embodiments. Modules 112a and 112b can have features generally similar to the features of the module 112 described above. Microchannels 114a and 114b can have features generally similar to the features of the microchannel 114 described above. The memory devices 104a and 104b can be HBM devices.

Figure 3D:
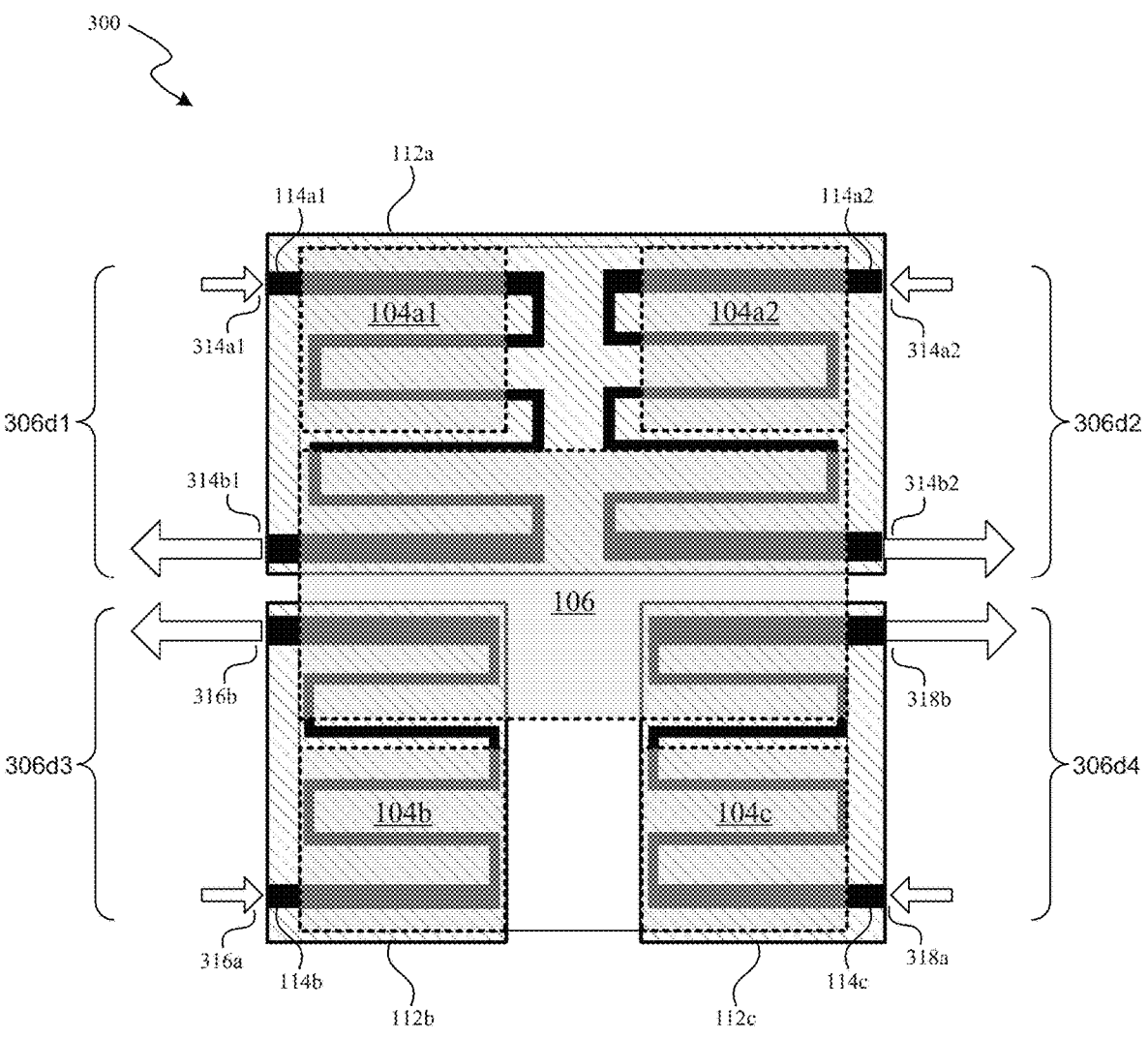

FIG. 3D shows an alternative configuration in which the network 300 has modules 112a, 112b, and 112c. The module 112a has microchannels 114a₁ and 114a₂. An inlet 314a₁ and an outlet 314b₁ of the microchannel 114a₁ can be at a region (not shown) corresponding to a memory device 104a₁ and a portion of the logic device 106. An inlet 314a₂ and an outlet 314b₂ of the microchannel 114b₂ can be at a region (not shown) corresponding to a memory device 104a₂ and a portion of the logic device 106. The module 112b has a microchannel 114b with an inlet 316a and an outlet 316b at a region (not shown) corresponding to a memory device 114b and a portion of the logic device 106. The module 112c has a microchannel 114c with an inlet 318a and an outlet 318b at a region (not shown) corresponding to a memory device 104c and a portion of the logic device 106. A coolant flows into the microchannels 114a₁, 114a₂, 114b, and 114c via the inlets 314a₁, 314a₂, 316a, and 318a and exits via the outlets 314b₁, 314b₂, 316b, and 318b, respectively. The flow paths 306d₁, 306d₂, 306d₃, and 306d₄ of the coolant remove heat from the memory devices 104a₁, 104a₂, 104b, and 104c, respectively, first and then the logic device 106 second. The flow paths can be reversed with the coolant flowing in opposite directions in other embodiments. Modules 112a, 112b, and 112c can have features generally similar to the features of the module 112 described above. Microchannels 114a₁, 114a₂, 114b, and 114c can have features generally similar to the features of the microchannel 114 described above. The memory devices 104a, 104b, and 104c can be HBM devices.

In some embodiments, a microchannel module can be connected to another microchannel module. For example, a first microchannel from a first microchannel module can have a flow path that is connected to a second microchannel from a second microchannel module to form a continuous flow path between the first microchannel and the second microchannel. This can be accomplished by connecting an outlet of the first microchannel to an inlet of the second microchannel.

In some embodiments, the microchannel 114 can have a plurality of portions. The cross section of a portion of the microchannel 114 can have the same or different dimension and shape from that of another portion of the microchannel 114 (i.e., the portions throughout the microchannel 114 can have constant or varying cross-sectional dimensions and shapes). For example, a cross-sectional height, width, and shape of a first portion can be different than that of a second portion.

Although FIGS. 3A-D show microchannels with a serpentine layout, the microchannel 114 can be configured with other suitable layouts (e.g., spiral and zig zag). In general, the microchannel 114 should be configured to inject the coolant under the hottest device and/or the device with the most limiting maximum operating temperature. The microchannel 114 can also be configured to cover a sufficient surface area under the components. The package 100 can include any number of memory devices 104, logic devices 106, modules 112, and microchannels 114. For example, package 100 can include one, two, tens, hundreds, or more microchannel modules 112. Each module 112 can include one, two, tens, hundreds, or more microchannels 114. The flow path of a microchannel within the module 112 can be continuous or discontinuous with another microchannel within the same module 112 or another module. One or more microchannel modules 112 and/or microchannels 114 can be proximate to one or more memory devices 104 and/or one or more logic devices 106.

Figure 4A:
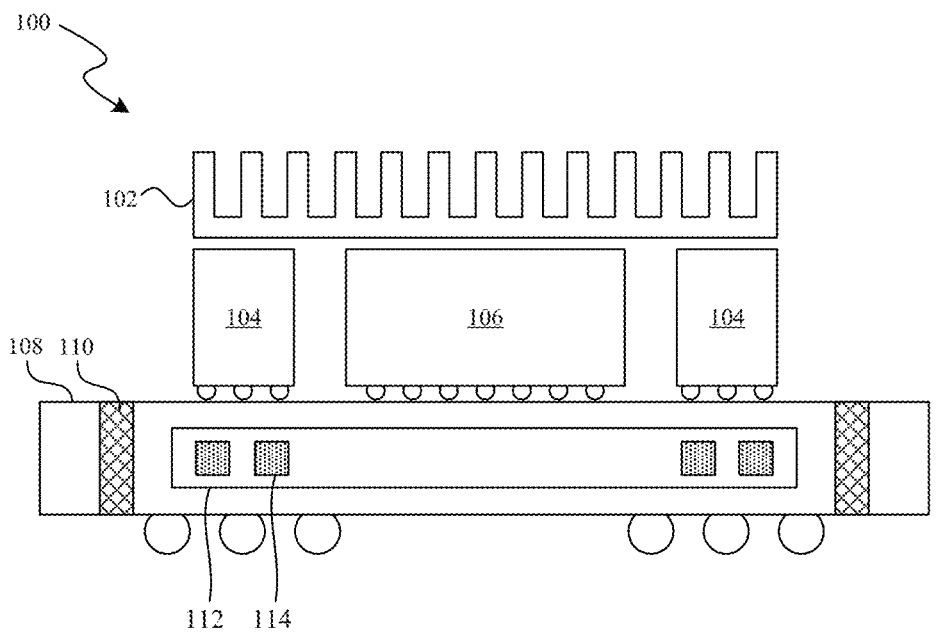
FIGS. 4A-E are cross-sectional views of semiconductor packages having microchannel modules with an aspect of having microchannels in accordance with the present technology.
Figure 4B:
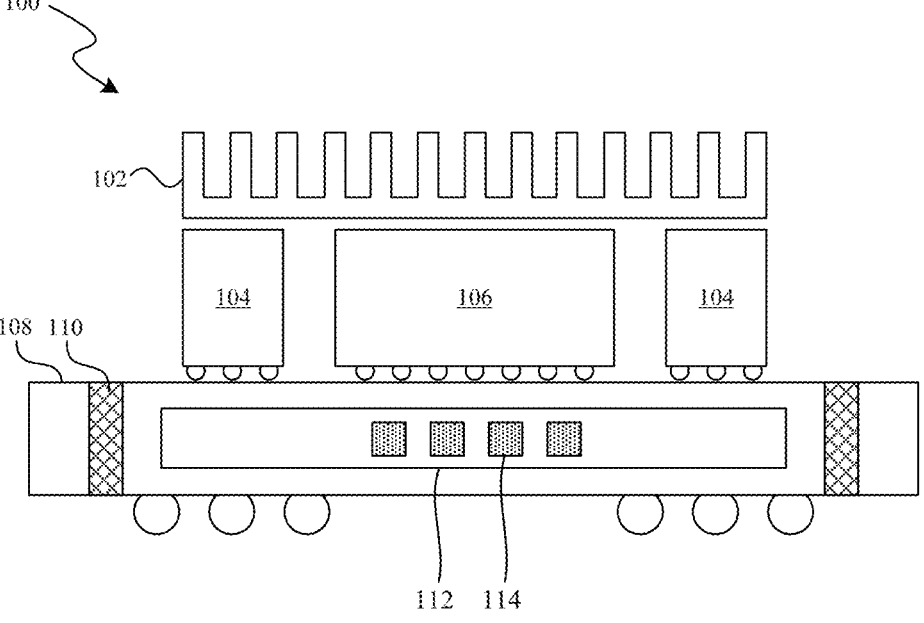
Figure 4C:
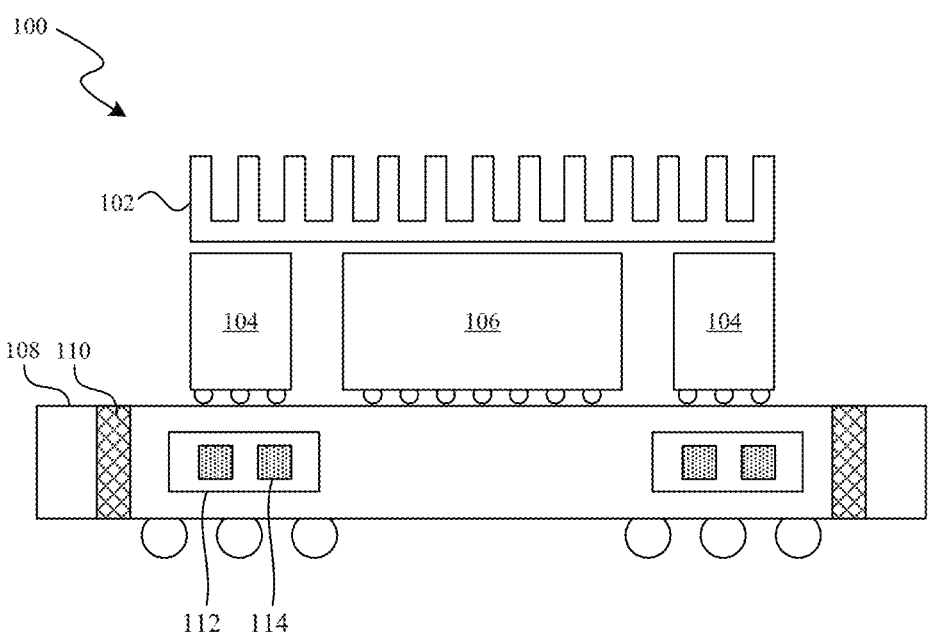
Figure 4D:
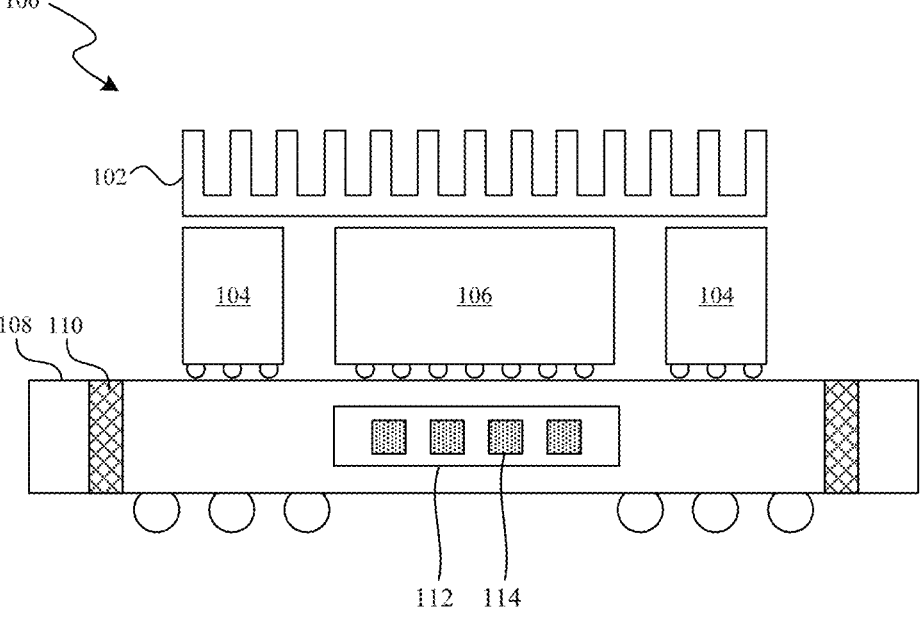
Figure 4E:
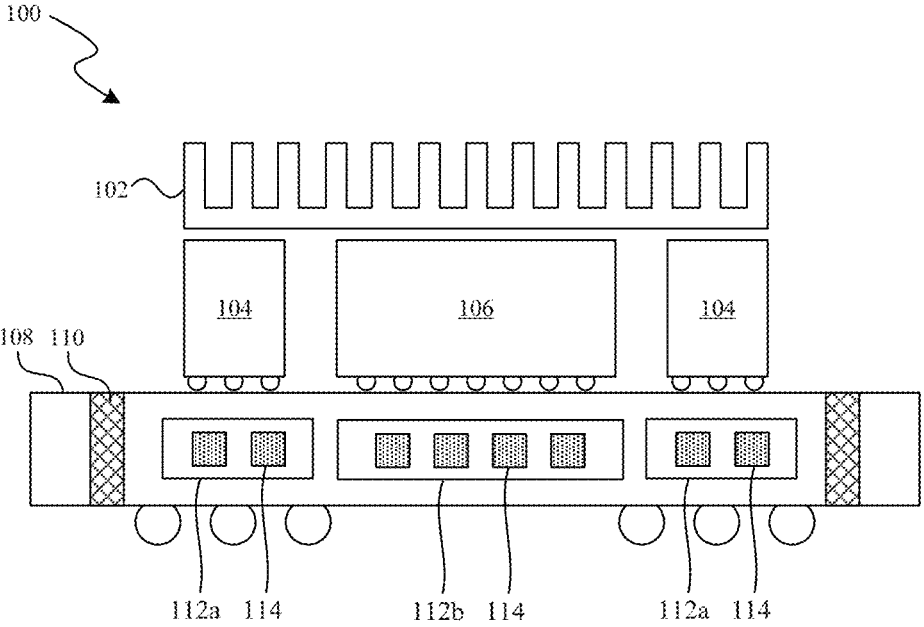

FIGS. 4A-E are cross-sectional views of semiconductor packages 100 having modules 112 with an aspect of having microchannels 114 in accordance with the present technology. FIG. 4A shows an embodiment of the package 100 with the module 112 proximate to the memory devices 104 and logic device 106, but the layout of the microchannel 114 is configured such that the microchannel 114 is under only the memory devices 104. In another embodiment as shown in FIG. 4B, the microchannel module 112 can be proximate to both the memory devices 104 and logic device 106, but the layout of the microchannel 114 is configured such that the microchannel 114 is under only the logic device 106. FIG. 4C shows an embodiment of the package 100 with two separate modules 112 integrated within the substrate 108 such that each module 112 is under only a corresponding memory device 104. In another embodiment as shown in FIG. 4D, the microchannel module 112 is integrated within the substrate 108 such that the module 112 is under only the logic device 106. FIG. 4E illustrates an embodiment of the package 100 with first modules 112a under corresponding memory devices 104 and a separate second module 112b under the logic device 106. The first and second modules 112a and 112b can have microchannels 114 that are separate from each other (e.g., independent inlets and outlets) or fluidically coupled together.

Figure 5A:
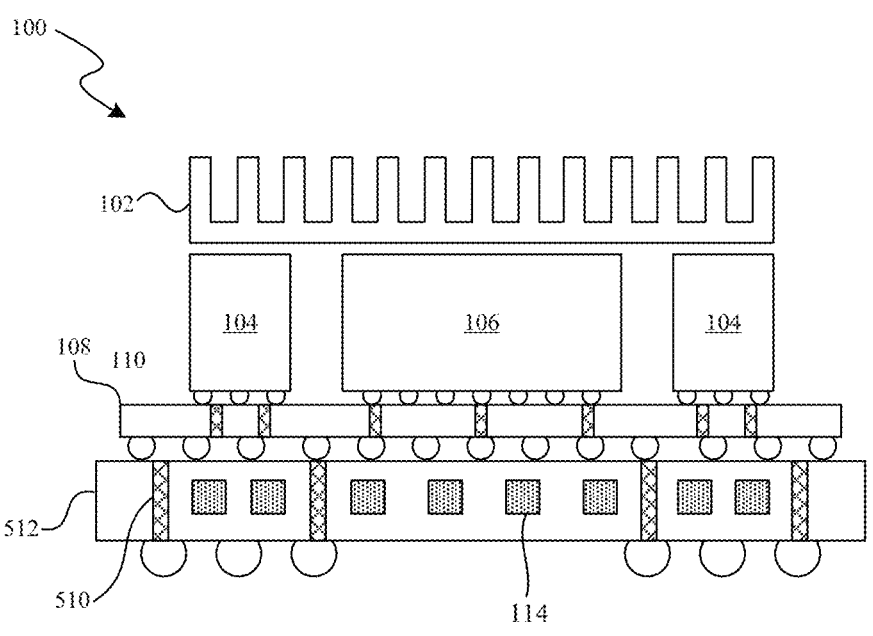
FIGS. 5A and 5B are cross-sectional views of semiconductor packages having microchannel modules with an aspect of having microchannels in accordance the present technology.
Figure 5B:
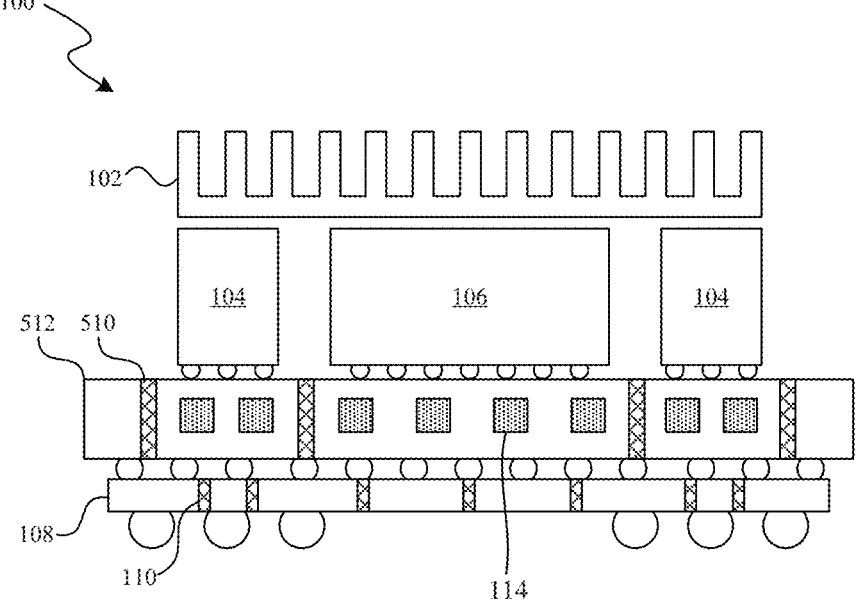

FIGS. 5A and 5B are cross-sectional views of semiconductor packages 100 having microchannel modules 512 ("modules 512") with an aspect of having microchannels 114 in accordance the present technology. Modules 512 are not integrated into the substrate 108 but rather are individual units separate from the substrate 108. The modules 512 can include one or more microchannels 114 and vias 510. As shown in FIG. 5A, the substrate 108 can be disposed between the module 512 and the memory devices 104 and the logic device 106. As shown in FIG. 5B, the microchannel module 512 can disposed between the substrate 108 and the memory devices 104 and the logic device 106. The module 512 can have features generally similar to the features of the module 112 described above. For example, the module 512 can have the microchannel 114 configured in a serpentine layout.

Figure 6:
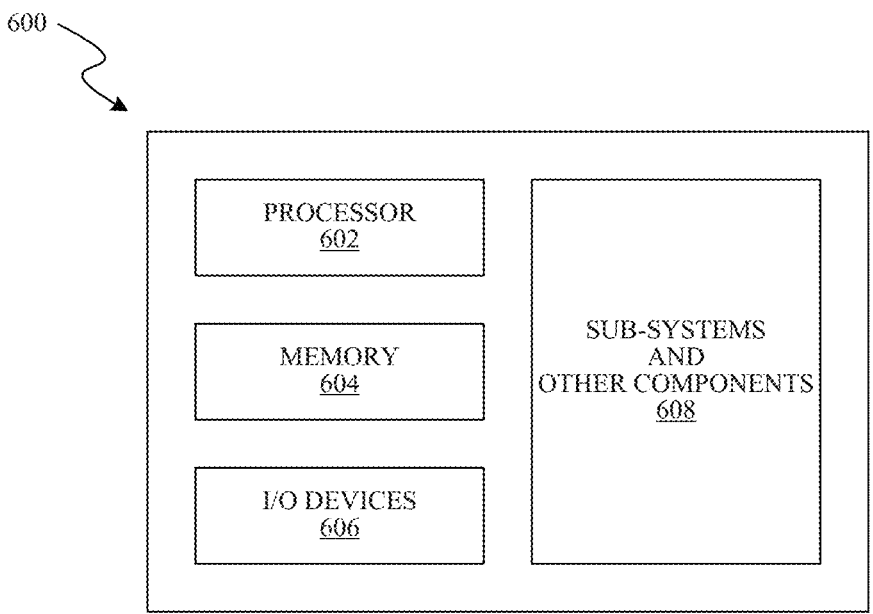
FIG. 6 is a schematic view of a system that includes the semiconductor package configured in accordance with the present technology.

FIG. 6 is a schematic view of a system that includes a semiconductor package configured in accordance with embodiments of the present technology. Any one of the semiconductor devices, packages, and/or assemblies having the features described above with reference to FIGS. 1-5B can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor packages described above with reference to FIGS. 1-5 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 600 include lights, cameras, vehicles, etc. With regard to these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

Although in the foregoing example embodiments semiconductor packages have been described and illustrated with HBM devices and GPUs, in other embodiments of the present technology, other memory devices and other logic devices may also be employed with the package substrate integrated with one or more microchannel modules as set forth in greater detail above. Moreover, in other embodiments of the present technology, the semiconductor package may employ one or more memory devices without a logic device with the package substrate integrated with one or more microchannel modules as set forth in greater detail above. Alternatively, in other embodiments of the present technology, the semiconductor package may employ one or more logic devices without a memory device with the package substrate integrated with one or more microchannel modules as set forth in greater detail above.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor assembly, comprising:

a printed circuit board (PCB) including a slot vertically spaced apart from and vertically enclosed by upper and lower surfaces of the PCB;

a microchannel module inserted in the slot and including a microchannel having a first duct and a second duct spaced apart from the first duct by a common thermally conductive wall, wherein the microchannel comprises multiple portions, the portions having different cross-sectional dimensions and/or shapes from one another;

a logic device mounted over the microchannel module on a first portion of the PCB such that the microchannel is configured to remove thermal energy from a bottom portion of the logic device; and a memory device mounted over the microchannel module on a second portion of the PCB, wherein the microchannel is configured to remove thermal energy from a bottom portion of the memory device, wherein (a) the memory device is positioned adjacent to an inlet of the microchannel and the logic device is positioned adjacent to an outlet of the microchannel, or (b) the memory device is positioned adjacent to the outlet of the microchannel and the logic device is positioned adjacent to the inlet of the microchannel, and wherein (i) the inlet is the only inlet of the microchannel and the outlet is one of a plurality of outlets of the microchannel, or (ii) the outlet is the only outlet of the microchannel and the inlet is one of a plurality of inlets of the microchannel.

2. The semiconductor assembly of claim 1, wherein the first duct and the second duct extend in at least approximately a same direction.

3. The semiconductor assembly of claim 1, wherein a first portion of a flow through the first duct has an approximately opposite direction to a second portion of the flow through the second duct.

4. The semiconductor assembly of claim 1, wherein the microchannel has one or more cross-sectional shapes, wherein the one or more cross-sectional shapes includes rectangular, rectilinear, circular, oval, elliptical, irregular, or any combination thereof.

5. The semiconductor assembly of claim 1, wherein the microchannel has a height less than 2 mm and the common thermally conductive wall has a width less than 0.25 mm.

6. The semiconductor assembly of claim 1, further comprising a coolant, wherein the coolant is contained within the microchannel.

7. The semiconductor assembly of claim 1, wherein the microchannel includes silicon, copper, or an organic material.

8. A method of forming a semiconductor assembly, the method comprising:

positioning a logic device relative to a mounting site of a printed circuit board (PCB) such that a microchannel module embedded in a slot of the PCB vertically spaced apart from and vertically enclosed by upper and lower surfaces of the PCB and including a microchannel is beneath the logic device;

mounting the logic device to a first portion of the PCB such that the microchannel is configured to remove thermal energy from a bottom portion of the logic device during operation;

positioning a memory device relative to the mounting site of the PCB such that the microchannel module is beneath the memory device; and mounting the memory device to a second portion of the PCB such that the microchannel is configured to remove thermal energy from a bottom portion of the memory device during operation;

wherein positioning the logic device and positioning the memory device comprise positioning one of the logic device and the memory device proximate to an inlet of the microchannel and positioning another one of the logic device and the memory device proximate to an outlet of the microchannel, wherein the microchannel comprises multiple portions, the portions having different cross-sectional dimensions and/or shapes from one another, and wherein (i) the inlet is the only inlet of the microchannel and the outlet is one of a plurality of outlets of the microchannel, or (ii) the outlet is the only outlet of the microchannel and the inlet is one of a plurality of inlets of the microchannel.

9. The method of claim 8, further comprising electrically coupling the logic device to contacts of the PCB.

10. The method of claim 8, further comprising electrically coupling the memory device to contacts of the PCB.

11. The method of claim 8, further comprising disposing a coolant within the microchannel.

12. The method of claim 8, wherein the first portion is one of a central portion and a peripheral portion.

13. The method of claim 12, wherein the second portion is another one of the central portion and the peripheral portion.

\* \* \* \* \*